(12) United States Patent
Moribayashi et al.

(10) Patent No.: US 10,271,419 B2
(45) Date of Patent: Apr. 23, 2019

(54) HEAT DISSIPATING STRUCTURE AND ELECTRONIC DEVICE

(71) Applicants: JVC KENWOOD Corporation, Yokohama-shi, Kanagawa (JP); DENSO CORPORATION, Kariya-shi, Aichi-pref (JP)

(72) Inventors: Takeshi Moribayashi, Yokohama (JP); Tatsuo Saito, Kariya (JP); Kazuaki Yanagimura, Kariya (JP); Hiromi Sekito, Kariya (JP)

(73) Assignees: JVC KENWOOD CORPORATION, Yokohama-Shi (JP); DENSO CORPORATION, Kariya-Shi (JP)

( * ) Notice: Subject to any disclaimer, the term of this patent is extended or adjusted under 35 U.S.C. 154(b) by 0 days.

(21) Appl. No.: 15/659,724

(22) Filed: Jul. 26, 2017

(65) Prior Publication Data
US 2018/0035530 A1    Feb. 1, 2018

(30) Foreign Application Priority Data

Jul. 28, 2016    (JP) ................................ 2016-148784

(51) Int. Cl.
| H05K 1/02 | (2006.01) |
| H05K 5/00 | (2006.01) |
| H05K 7/20 | (2006.01) |

(52) U.S. Cl.
CPC ......... *H05K 1/0203* (2013.01); *H05K 1/0209* (2013.01); *H05K 5/0008* (2013.01);
(Continued)

(58) Field of Classification Search
CPC .. H05K 1/0203; H05K 5/0008; H05K 1/0209; H05K 7/20445; H05K 5/0091; H05K 2201/066
(Continued)

(56) References Cited

U.S. PATENT DOCUMENTS

| 3,519,889 A | * | 7/1970 | Monaco | ............. | H01L 23/4093 |
| | | | | | 165/80.3 |
| 3,859,570 A | * | 1/1975 | Veranth | ............... | H01L 23/4006 |
| | | | | | 257/718 |

(Continued)

FOREIGN PATENT DOCUMENTS

| JP | 2009-082297 | 4/2009 |
| JP | 2013-125897 | 6/2013 |

*Primary Examiner* — Anatoly Vortman
(74) *Attorney, Agent, or Firm* — Amin, Turocy & Watson LLP (57) ABSTRACT

A heat dissipating structure includes an integrated circuit; a bracket; a heat sink; a housing; a first fastening member that is inserted into a first fastening hole provided to the bracket, and is inserted into a fastening hole provided to the heat sink, and that assembles the integrated circuit to the bracket and the heat sink, while a surface of the integrated circuit contacts with the bracket, and another surface contacts with the heat sink; and a second fastening member that is inserted into a second fastening hole provided to the bracket, and into a fastening hole provided to the housing, and assembles the bracket to the housing. The heat sink includes one surface that contacts with the housing, the one surface being on a side opposite to a surface contact with the integrated circuit, and the one first fastening member is positioned spaced from the housing.

5 Claims, 6 Drawing Sheets

(52) U.S. Cl.
CPC ....... *H05K 5/0091* (2013.01); *H05K 7/20445* (2013.01); *H05K 2201/066* (2013.01)

(58) Field of Classification Search
USPC .......................................... 361/720
See application file for complete search history.

(56) References Cited

U.S. PATENT DOCUMENTS

| | | | | |
|---|---|---|---|---|
| 4,204,248 A * | 5/1980 | Proffit | ................ | H01L 23/3672 174/16.3 |
| 4,288,839 A * | 9/1981 | Prager | ................ | H01L 23/4006 257/717 |
| 4,471,407 A * | 9/1984 | Sleder | ................ | H01L 23/24 165/185 |
| 4,669,028 A * | 5/1987 | Faa, Jr. | ................ | H01L 23/4006 165/185 |
| 4,674,005 A * | 6/1987 | Lacz | ................ | H05K 7/2049 174/16.3 |
| 4,695,924 A * | 9/1987 | Wozniczka | ......... | H01L 23/4006 174/16.3 |
| 4,707,726 A * | 11/1987 | Tinder | ................ | H01L 23/4006 165/80.1 |
| 4,923,179 A * | 5/1990 | Mikolajczak | ....... | H01L 23/4093 165/80.3 |
| 5,031,028 A * | 7/1991 | Galich | ................ | H01L 23/4093 174/16.3 |
| 5,172,756 A * | 12/1992 | Jayamanne | ......... | H01L 23/4006 165/80.3 |
| 5,191,512 A * | 3/1993 | Ogura | ................ | H01L 23/4006 257/E23.084 |
| 5,327,324 A * | 7/1994 | Roth | ................ | H05K 7/20854 174/16.3 |
| 5,461,541 A * | 10/1995 | Wentland, Jr. | ..... | H05K 7/20854 24/570 |
| 5,936,839 A * | 8/1999 | Saito | ................ | H05K 9/0049 174/16.3 |
| 6,266,244 B1 * | 7/2001 | Guthrie | ................ | H01L 23/40 165/80.3 |
| 6,515,858 B2 * | 2/2003 | Rodriguez | ......... | H05K 7/20909 165/104.33 |
| 6,781,840 B2 * | 8/2004 | Ikushima | ........... | H05K 7/20445 165/185 |
| 7,580,264 B2 * | 8/2009 | Tanimoto | ............ | H01L 23/3672 165/185 |
| 7,863,528 B2 * | 1/2011 | Poidl | ................ | H05K 7/20418 174/548 |
| 8,363,409 B2 * | 1/2013 | Chung | ................ | H01L 23/4006 165/104.33 |
| 2009/0084971 A1 | 4/2009 | Ohta et al. | | |

\* cited by examiner

HEAT DISSIPATING STRUCTURE AND ELECTRONIC DEVICE

CROSS-REFERENCE TO RELATED APPLICATION(S)

The present application claims priority to and incorporates by reference the entire contents of Japanese Patent Application No. 2016-148784 filed in Japan on Jul. 28, 2016.

BACKGROUND OF THE INVENTION

1. Field of the Invention

The present invention relates to a heat dissipating structure and an electronic device.

2. Description of the Related Art

Electronic devices are known to be provided with a heat dissipating structure because components, such as a control circuit, mounted on a circuit board generates heat (see Japanese Laid-open Patent Publication No. 2009-082297 and Japanese Laid-open Patent Publication No. 2013-125897, for example). In the technology disclosed in Japanese Laid-open Patent Publication No. 2009-082297, a first heat dissipating member and a second heat dissipating member are disposed such that a reading integrated circuit (IC) and signal lines are interposed between these heat dissipating members. An external surface of the first heat dissipating member is then brought into close contact with and fixed to the inner surface of a housing. In the technology disclosed in Japanese Laid-open Patent Publication No. 2013-125897, a plurality of heat-generating components are pressed, by a pressing member, against a side wall of a bracket serving as a heat dissipating surface, with a heat-dissipation sheet interposed between the heat-generating components and the side wall of the bracket.

The heat dissipating member that is kept in close contact with an electronic component that generates heat becomes highly heated by the heat conducted from the electronic component. When a fastening member is used to fix the heat dissipating member onto the housing, for example, the fastening member might become high in temperature. Therefore, when such a member becomes high in temperature is assembled to the housing, it is preferable for such a member not to be exposed to the external of the housing.

SUMMARY OF THE INVENTION

It is an object of the present invention to at least partially solve the problems in the conventional technology.

A heat dissipating structure of the present disclosure includes: an electronic component that generate heat; a bracket configured to support the electronic component; a heat dissipating member configured to dissipate the heat generated by the electronic component; a housing to which the bracket is assembled; a first fastening member configured to be inserted into a first fastening hole provided to the bracket, and into a fastening hole provided to the heat dissipating member, and assemble the electronic component to the bracket and the heat dissipating member, while one surface of the electronic component is held in close contact with the bracket, and another surface facing the one surface is held in close contact with the heat dissipating member; and a second fastening member configured to be inserted into a second fastening hole provided to the bracket, and into a fastening hole provided to the housing, and assemble the bracket to the housing, while the heat dissipating member is pressed against the housing. The heat dissipating member has one surface that is held in close in contact with the housing, the one surface being on a side opposite to a surface that is held in close contact with the electronic component, in a state in which the bracket is assembled to the housing. The first fastening member is configured to be positioned spaced from the housing in the state in which the bracket is assembled to the housing.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

An electronic device 1 provided with a heat dissipating structure 10 according to some embodiments of the present invention will now be explained in detail with reference to the appended drawings. The embodiments described below are, however, not intended to limit the scope of the present invention in any way.

First Embodiment

Figure 1:
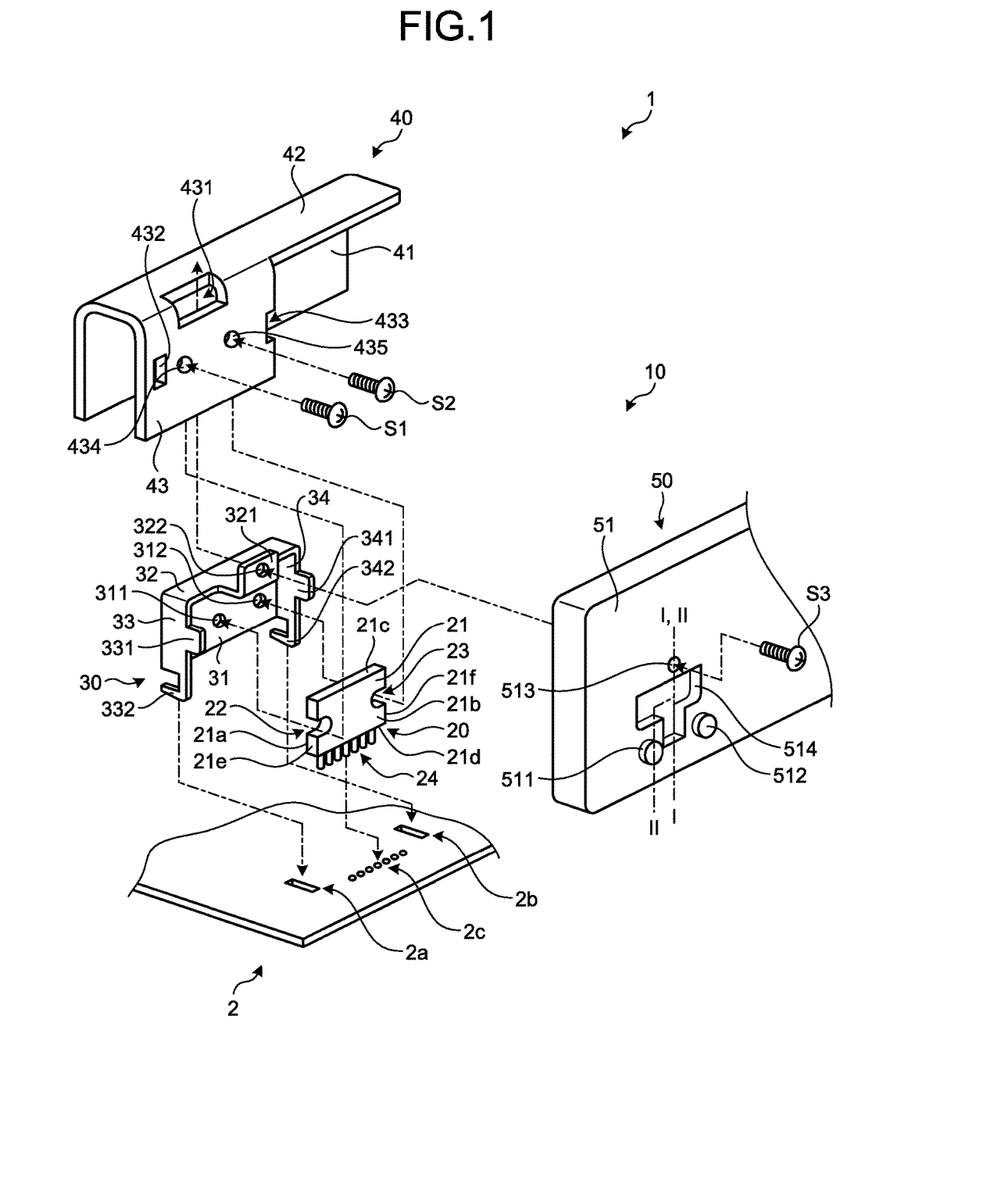
FIG. 1 is an exploded perspective view illustrating an electronic device having a heat dissipating structure according to a first embodiment of the present invention.
Figure 2:
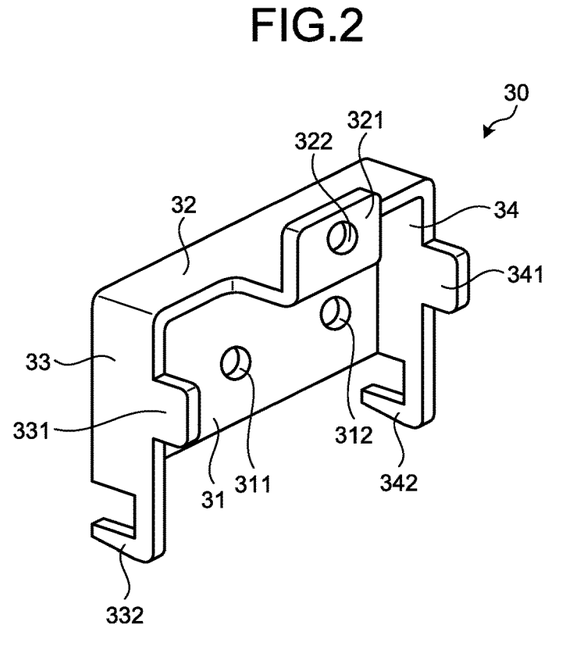
FIG. 2 is a perspective view illustrating a bracket included in the heat dissipating structure according to the first embodiment.
Figure 3:
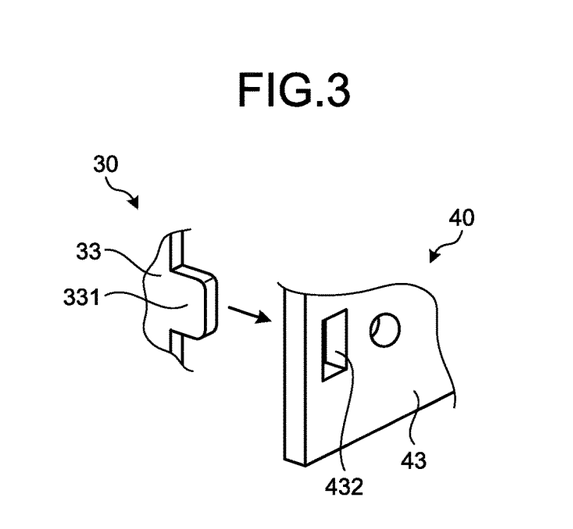
FIG. 3 is a partially enlarged view for explaining the alignment of the heat dissipating structure according to the first embodiment.
Figure 4:
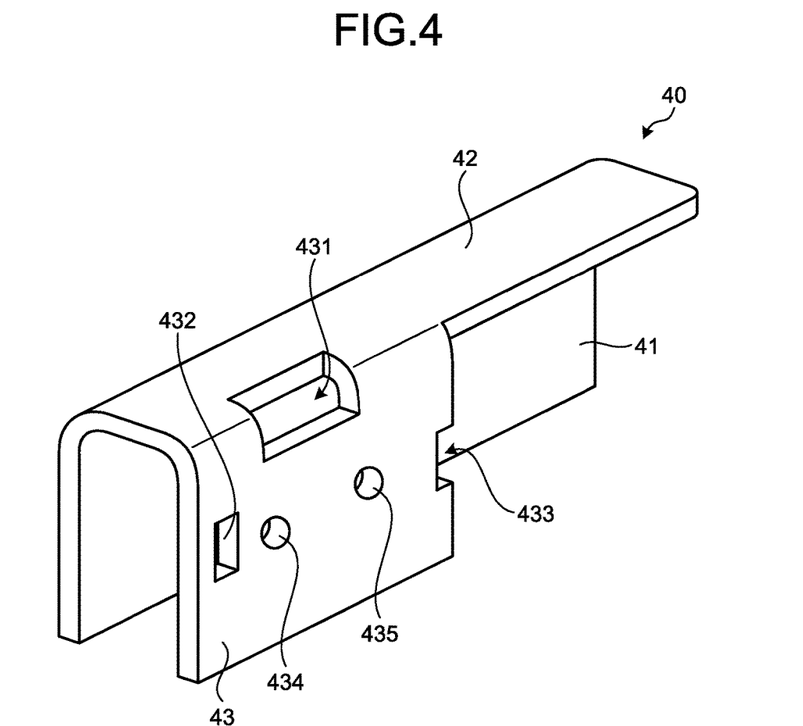
FIG. 4 is a perspective view illustrating a heat sink included in the heat dissipating structure according to the first embodiment.

FIG. 1 is an exploded perspective view illustrating an electronic device having a heat dissipating structure according to a first embodiment of the present invention. FIG. 2 is a perspective view illustrating a bracket included in the heat dissipating structure according to the first embodiment. FIG. 3 is a partially enlarged view for explaining the alignment of the heat dissipating structure according to the first embodiment. FIG. 4 is a perspective view illustrating a heat sink included in the heat dissipating structure according to the first embodiment. The electronic device 1 is, for example, an audio-and-video (AV) integrated car navigation system, or a car audio system.

The electronic device 1 will now be explained with reference to FIG. 1. The electronic device 1 includes a circuit board 2 and a heat dissipating structure 10.

The circuit board 2 is a board-shaped printed circuit board. More specifically, the circuit board 2 is provided as a board member made of an insulator on which electronic components such as an integrated circuit (IC) 20, a resistor, a capacitor, and a transistor that are electrically connected to one another are mounted, for example. The circuit board 2 outputs control signals to each components of the electronic device 1. The circuit board 2 is provided with an engaging hole 2a and an engaging hole 2b for aligning a bracket 30, and through holes 2c through which terminals of the integrated circuit 20 are inserted.

The heat dissipating structure 10 dissipates heat to be generated. The heat dissipating structure 10 includes: the integrated circuit 20; the bracket 30; a heat sink (heat dissipating member) 40; a housing 50; a first fastening member S1 and a first fastening member S2 for assembling the integrated circuit 20 to the bracket 30 and the heat sink 40; and a second fastening member S3 for assembling the bracket 30 to the housing 50.

The integrated circuit 20 has a thin, rectangular parallelepiped, and box-like case 21 for housing a circuit board on which electronic components that generate heat are mounted. The case 21 of the integrated circuit 20 becomes high in temperature by the heat generated by the electronic components mounted on the integrated circuit 20. The case 21 has a principal surface 21a, another principal surface 21b facing the principal surface 21a, and four side surfaces 21c, 21d, 21e, and 21f connecting the respective ends of the principal surface 21a and principal surface 21b facing each other. A holding portion 22 and a holding portion 23 are provided at both ends of the case 21 in a lateral width direction. The holding portion 22 and the holding portion 23 are provided at a center of the case 21 in the height direction. Shafts of the first fastening member S1 and the first fastening member S2 are inserted into the holding portion 22 and the holding portion 23, respectively. Each of the holding portion 22 and the holding portion 23 is formed by making a recess on the case 21 in the lateral width direction. The holding portion 22 and the holding portion 23 are provided in a size slightly larger than the external circumference of the shafts of the first fastening member S1 and the first fastening member S2. A plurality of terminals 24 protrude downwardly from the side surface 21d of the case 21. The terminals 24 output electric signals generated by the circuit board in the integrated circuit 20. The terminals 24 are inserted into the through holes 2c, respectively, provided on the circuit board 2 and soldered.

The bracket 30 will now be explained with reference to FIGS. 1 and 2. The bracket 30 has a shape of a case that is supported by the housing 50, while covering the integrated circuit 20. The bracket 30 is formed by bending a plate material. The bracket 30 is made of a material that is less heat-conductive than the case 21 of the integrated circuit 20 and the heat sink 40. Therefore, the heat generated by the integrated circuit 20 is not easily conducted to the bracket 30 in the assembled state. The bracket 30 has a main body 31, and a side wall 32, a side wall 33, and a side wall 34 that are provided uprightly from the respective ends of the main body 31.

The main body 31 has a rectangular shape having a larger area than the principal surface 21a of the case 21 of the integrated circuit 20. The main body 31 is kept in close contact with the principal surface 21a of the case 21 of the integrated circuit 20 in the assembled state. The main body 31 is provided with a first fastening hole 311 and a first fastening hole 312 at the positions corresponding to the holding portion 22 and the holding portion 23, respectively, provided to the integrated circuit 20. The first fastening hole 311 and the first fastening hole 312 have a female screw.

The side wall 32 has a rectangular shape having a larger area than the side surface 21c of the case 21 of the integrated circuit 20. The side wall 32 is positioned in a manner spaced from the side surface 21c of the case 21 of the integrated circuit 20 in the assembled state.

The side wall 32 has a protrusion 321 protruding upwardly from an end thereof on the side opposite to another end with the main body 31. The protrusion 321 is provided at a center of the side wall 32 in the lateral width direction. The protrusion 321 has a rectangular shape. The protrusion 321 has a second fastening hole 322. The second fastening hole 322 is provided with a female screw.

The side wall 33 has a rectangular shape having a larger area than the side surface 21e of the case 21 of the integrated circuit 20. The side wall 33 is positioned in a manner spaced from the side surface 21e of the case 21 of the integrated circuit 20 in the assembled state.

The side wall 33 has a first engaging portion 331 that is uprightly provided to the end thereof on the side opposite to the end with the main body 31. The first engaging portion 331 extends on the same plane as the side wall 33. The first engaging portion 331 is provided at a center of the side wall 33 in the height direction. The first engaging portion 331 has a rectangular plate-shape. The first engaging portion 331 is used in aligning with the heat sink 40 during the assembly process. More specifically, as illustrated in FIG. 3, the first engaging portion 331 aligns the bracket 30 and the heat sink 40 with respect to each other in the height direction and the lateral width direction, by being engaged with an engaging hole (engagement accepting portion) 432 provided to the heat sink 40.

A second engaging portion 332 is provided uprightly to the bottom end of the side wall 33 toward the downward direction. The second engaging portion 332 is provided as an L-shaped foot. The second engaging portion 332 is used in aligning with the circuit board 2 during the assembly process. More specifically, the second engaging portion 332 aligns the bracket 30 with respect to the circuit board 2 in the height direction and the lateral width direction, by being engaged with the engaging hole 2a of the circuit board 2. The second engaging portion 332 is inserted into and soldered with the engaging hole 2a of the circuit board 2.

The side wall 34 is positioned on a plane extending in parallel with the side wall 33. The side wall 34 has a rectangular shape having a larger area than the side surface 21f of the case 21 of the integrated circuit 20. The side wall 34 is positioned in a manner spaced from the side surface 21f of the case 21 of the integrated circuit 20 in the assembled state.

The side wall 34 has a first engaging portion 341 that is uprightly provided to an end thereof on the side opposite to the end with the main body 31. The first engaging portion 341 extends on the same plane as the side wall 34. The first engaging portion 341 is provided at a center of the side wall 34 in the height direction. The first engaging portion 341 has a rectangular plate-shape. The first engaging portion 341 is used in aligning with the heat sink 40 during the assembly process. More specifically, the first engaging portion 341 aligns the bracket 30 with respect to the heat sink 40 in the height direction and lateral width direction by being engaged with the engaging cutout (engagement accepting portion) 433 provided to the heat sink 40.

A second engaging portion 342 is provided uprightly to the bottom end of the side wall 34 toward the downward direction. The second engaging portion 342 is provided as an L-shaped foot. The second engaging portion 342 is used in aligning with the circuit board 2 during the assembly process. More specifically, the second engaging portion 342 aligns the bracket 30 with respect to the circuit board 2 in the height direction and the lateral width direction, by being engaged with the engaging hole 2b of the circuit board 2. The second engaging portion 342 is inserted into and soldered with the engaging hole 2b of the circuit board 2.

The heat sink 40 will now be explained with reference to FIGS. 1 and 4. The heat sink 40 dissipates the heat of the integrated circuit 20. The heat sink 40 is formed by bending a plate material. The heat sink 40 is made of a material that is more heat-conductive than those of case 21 of the integrated circuit 20, the bracket 30, and the housing 50. Therefore, when the temperature of the heat sink 40 is lower than that of the case 21 of the integrated circuit 20 in the assembled state, the heat generated by the integrated circuit 20 is conducted to the heat sink 40. The heat sink 40 is made from an aluminum plate, for example. The cross section of the heat sink 40 has a reversed U-shape, in the lateral view. More specifically, the heat sink 40 includes a main body 41, a connecting portion 42 extending from the upper end of the main body 41 onto a plane that is perpendicular to the main body 41, and a contact portion 43 extending downwardly from an end of the connecting portion 42, on a plane in parallel with the main body 41.

The main body 41 has a rectangular shape having a larger area than the main body 31 of the bracket 30. The main body 41 has an area larger than the contact portion 43. The main body 41 is positioned on a plane extending in parallel with the main body 31 of the bracket 30 in the assembled state. The space between the main body 41 and the main body 31 of the bracket 30 serves as a channel for the air coming out from a cooling fan not illustrated.

The connecting portion 42 is positioned between the main body 41 and the contact portion 43. The connecting portion 42 has a rectangular shape having a larger area than the side wall 32 of the bracket 30. The connecting portion 42 is positioned in a manner spaced from the side wall 32 of the bracket 30 in the assembled state.

The contact portion 43 has a rectangular shape having a larger area than the principal surface 21b of the case 21 of the integrated circuit 20. The contact portion 43 is held in a close contact with the principal surface 21b of the case 21 of the integrated circuit 20 in the assembled state.

An insertion hole 431 is provided to a bent portion that is a portion where the contact portion 43 meets the connecting portion 42. The insertion hole 431 is provided at a center of the contact portion 43 in the lateral width direction. The insertion hole 431 has a rectangular shape. The protrusion 321 of the bracket 30 is inserted into the insertion hole 431 in the assembled state process. It is preferable for the area of the insertion hole 431 to be as small as possible so that the heat conductivity of the heat sink 40 is not lost.

An engaging hole 432 is provided to one end of the contact portion 43 in the lateral width direction. The engaging hole 432 is provided at a center of the contact portion 43 in the height direction. The engaging hole 432 has a rectangular shape. The engaging hole 432 is used in aligning with the bracket 30, during the assembly process. More specifically, the engaging hole 432 aligns the heat sink 40 with respect to the bracket 30 in the height direction and the lateral width direction, by being engaged with the first engaging portion 331 of the bracket 30.

An engaging cutout 433 is provided to the other end of the contact portion 43 in the lateral width direction. The engaging cutout 433 is provided at a center of the contact portion 43 in the height direction. The engaging cutout 433 has a cornered U-shape. The engaging cutout 433 is used in aligning with the bracket 30 during the assembly process. More specifically, the engaging cutout 433 aligns the heat sink 40 with respect to the bracket 30 in the height direction and the lateral width direction by being engaged with the first engaging portion 341 of the bracket 30.

The contact portion 43 is provided with a fastening hole 434 and a fastening hole 435 at the positions corresponding to the holding portion 22 and the holding portion 23, respectively, provided to the integrated circuit 20, in the assembled state.

Referring back to FIG. 1, the housing 50 will now be explained. The housing 50 covers the external circumference of the electronic device 1. To the housing 50, the bracket 30 is assembled. In this embodiment, the housing 50 is a rear panel. The housing 50 includes a panel plate 51.

Assembled to the panel plate 51 is the bracket 30. The panel plate 51 is made of a material that is less heat-conductive than the heat sink 40. Therefore, in the assembled state, the heat conducted from the integrated circuit 20 to the heat sink 40 is not easily conducted to the panel plate 51. Furthermore, the heat conducted from the integrated circuit 20 to the bracket 30 is not easily conducted to the panel plate 51 in the assembled state.

A convex portion 511 is provided to the panel plate 51 at a position corresponding to the holding portion 22 of the integrated circuit 20 in the assembled state. The convex portion 511 has a cylindrical shape. The convex portion 511 is formed by drawing in such a manner that the convex portion 511 bulges toward the side opposite to the side to which the heat sink 40 is assembled. The convex portion 511 houses the head of the first fastening member S1 protruding from the fastening hole 434 of the heat sink 40, in a manner spaced from the convex portion 511, in the assembled state.

A convex portion 512 is provided to the panel plate 51 at a position corresponding to the holding portion 23 of the integrated circuit 20, in the assembled state. The convex portion 512 has a cylindrical shape. The convex portion 512 is formed by drawing in such a manner that the convex portion 512 bulges toward the side opposite to the side to which the heat sink 40 is assembled. The convex portion 512 houses the head of the first fastening member S2 protruding from the fastening hole 435 of the heat sink 40, in a manner spaced from the convex portion 512, in the assembled state.

A fastening hole 513 is provided to the panel plate 51 at a position corresponding to the second fastening hole 322 of the bracket 30, in the assembled state.

A concave portion 514 is provided to the panel plate 51 at a position contacting to the contact portion 43 of the heat sink 40, in the assembled state. The concave portion 514 has a T-shape in the plan view. The concave portion 514 is formed by drawing in such a manner that the concave portion 514 bulges toward the side on which the heat sink 40 is assembled. In other words, the concave portion 514 is provided in a manner bulging toward the side opposite to the convex portion 511 and the convex portion 512. The concave portion 514 abuts against the contact portion 43 of the heat sink 40, at a position corresponding to the portion that is held in close contact with the principal surface 21b of the case 21 of the integrated circuit 20. The concave portion 514 is not limited to this shape, and the concave portion 514 may have any other shape that is brought into close contact with the principal surface 21b of the case 21 of the integrated circuit 20 at a wider area, or may be positioned in any other ways.

The first fastening member S1 and the first fastening member S2 will now be explained. The first fastening member S1 is inserted into the fastening hole 434 provided to the heat sink 40 and the first fastening hole 311 provided to the bracket 30. The first fastening member S2 is inserted into the fastening hole 435 provided to the heat sink 40 and the first fastening hole 312 provided to the bracket 30. The first fastening member S1 and the first fastening member S2 assemble the integrated circuit 20 with the bracket 30 and the heat sink 40, while the principal surface 21a of the case 21 of the integrated circuit 20 is kept in close contact with the bracket 30, and while the principal surface 21b of the case 21 of the integrated circuit 20 is kept in close contact with the heat sink 40.

The second fastening member S3 will now be explained. The second fastening member S3 is inserted into the fastening hole 513 provided to the housing 50, and the second fastening hole 322 provided to the bracket 30. The second fastening member S3 assembles the bracket 30 to the housing 50, with pressing the heat sink 40 to the housing 50.

A method for assembling the heat dissipating structure 10 in the electronic device 1 having such a configuration, and the effects will now be explained.

The method for assembling the heat dissipating structure 10 in the electronic device 1 will now be explained.

To begin with, an assembler holds the case 21 of the integrated circuit 20 between the bracket 30 and the heat sink 40. More specifically, the assembler brings the principal surface 21a of the case 21 of the integrated circuit 20 into contact with the main body 31 of the bracket 30. The assembler then inserts the protrusion 321 of the bracket 30 into the insertion hole 431 of the heat sink 40, and inserts the first engaging portion 331 and the first engaging portion 341 of the bracket 30 into the engaging hole 432 and the engaging cutout 433 of the heat sink 40, respectively. The assembler then brings the principal surface 21b of the case 21 of the integrated circuit 20 into contact with the contact portion 43 of the heat sink 40. In this manner, the integrated circuit 20, the bracket 30, and the heat sink 40 are aligned in the height direction and the lateral width direction. At this time, the fastening hole 434 provided to the heat sink 40, the holding portion 22 provided to the case 21 of the integrated circuit 20, and the first fastening hole 311 provided to the bracket 30 are coaxially aligned in an overlapping manner. The fastening hole 435 provided to the heat sink 40, the holding portion 23 provided to the case 21 of the integrated circuit 20, and the first fastening hole 312 provided to the bracket 30 are also coaxially aligned in an overlapping manner. The assembler then fastens the first fastening member S1, while the fastening hole 434 provided to the heat sink 40, the holding portion 22 provided to the case 21 of the integrated circuit 20, and the first fastening hole 311 provided to the bracket 30 are coaxially aligned in an overlapping manner. In the same manner, the assembler fastens the first fastening member S2, while the fastening hole 435 provided to the heat sink 40, the holding portion 23 provided to the case 21 of the integrated circuit 20, and the first fastening hole 312 provided to the bracket 30 are coaxially aligned in an overlapping manner.

In the manner described above, the integrated circuit 20, the bracket 30, and the heat sink 40 are assembled, with the case 21 of the integrated circuit 20 interposed between the bracket 30 and the heat sink 40. In this state, the surface of the main body 31 of the bracket 30 is held in close contact with the principal surface 21a of the case 21 of the integrated circuit 20. The surface of the contact portion 43 of the heat sink 40 is in close contact with the principal surface 21b of the case 21 of the integrated circuit 20.

Figure 5:
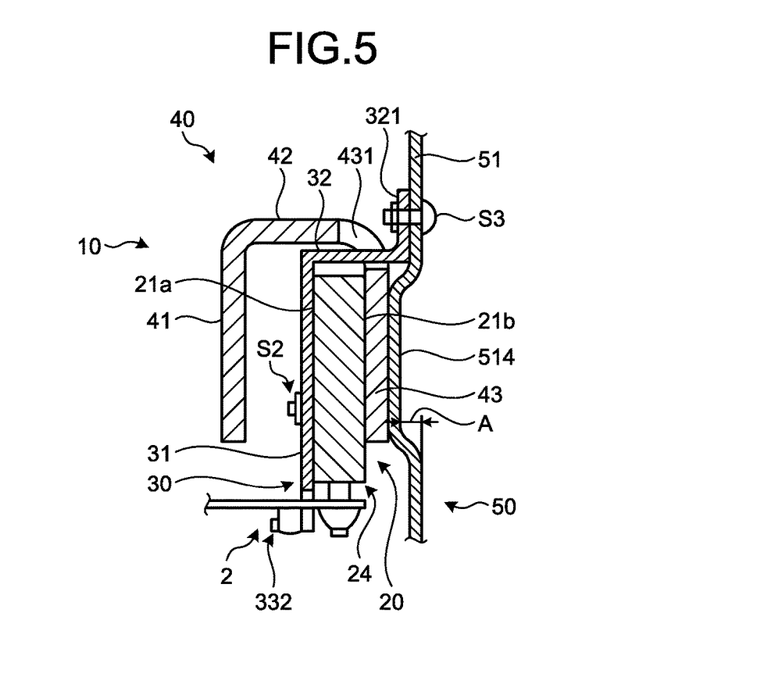
FIG. 5 is a partial sectional view of a concave portion of the heat dissipating structure according to the first embodiment, and is a sectional view across the line I-I in FIG. 1.

The assembler then assembles the assembly of the integrated circuit 20, the bracket 30, and the heat sink 40 onto the circuit board 2. More specifically, the assembler inserts the terminals 24 of the integrated circuit 20 into the respective through holes 2c on the circuit board 2, and fixes the terminals 24 to the circuit board 2 by soldering. The assembler engages the second engaging portion 332 of the bracket 30 into the engaging hole 2a on the circuit board 2, and fixes the engagement by soldering. The assembler also engages the second engaging portion 342 of the bracket 30 into the engaging hole 2b of the circuit board 2, and fixes the engagement by soldering. In the manner described above, the assembly of the integrated circuit 20, the bracket 30, and the heat sink 40 is assembled onto the circuit board 2. In this configuration, the second fastening hole 322 provided to the bracket 30 and the fastening hole 513 provided to the panel plate 51 of the housing 50 are coaxially aligned in an overlapping manner. FIG. 5 is a partial sectional view of the concave portion of the heat dissipating structure according to the first embodiment, and is a sectional view across the line I-I in FIG. 1. At this time, the contact portion 43 provided to the heat sink 40 is held in close contact with the surface of the concave portion 514 provided to the panel plate 51 of the housing 50. In the configuration before the second fastening member S3 is fastened, the protrusion 321 of the bracket 30 is positioned slightly spaced from the panel plate 51 of the housing 50. By bringing these members into close contact with each other by fastening, the contact portion 43 and the concave portion 514 are brought into close contact with each other by the pressure applied thereto. In this embodiment, in the configuration before the second fastening member S3 is fastened, the protrusion 321 of the bracket 30 is spaced from the panel plate 51 of the housing 50 by a distance d.

Figure 6:
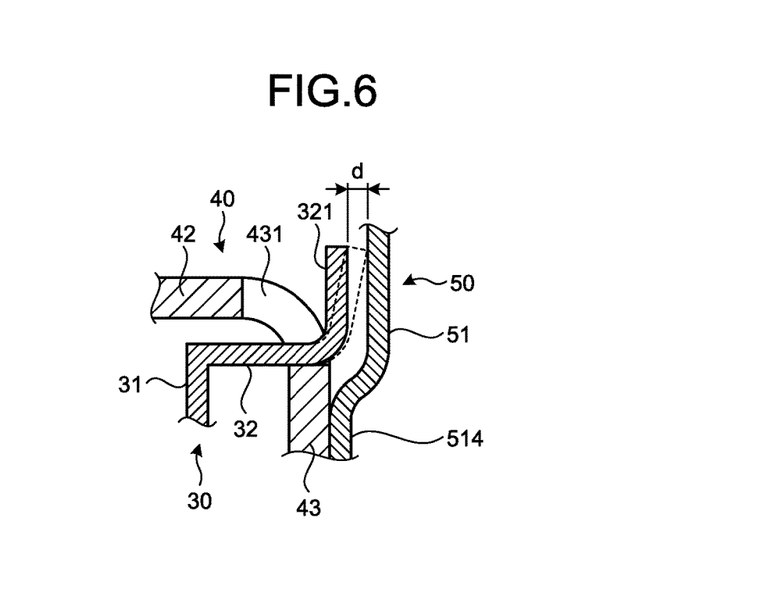
FIG. 6 is a partial sectional view illustrating the heat dissipating structure according to the first embodiment.
Figure 7:
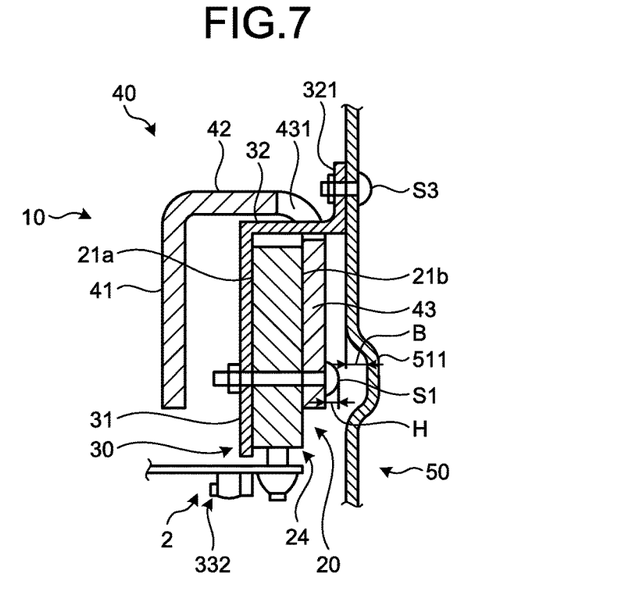
FIG. 7 is a partial sectional view of a convex portion of the heat dissipating structure according to the first embodiment, and is a sectional view across the line II-II in FIG. 1.

The assembler then assembles the assembly of the integrated circuit 20, the bracket 30, and the heat sink 40 having been assembled onto the circuit board 2, further to the housing 50. More specifically, the assembler lays and presses the protrusion 321 of the bracket 30 to the panel plate 51 of the housing 50. The assembler fastens the second fastening member S3 while the second fastening hole 322 provided to the bracket 30 and the fastening hole 513 provided to the panel plate 51 of the housing 50 are coaxially aligned in an overlapping manner, as illustrated in FIGS. 6 and 7. FIG. 6 is a partial sectional view illustrating the heat dissipating structure according to the first embodiment. FIG. 7 is a partial sectional view of the convex portion of the heat dissipating structure according to the first embodiment, and is a sectional view across the line II-II in FIG. 1.

In the manner described above, the integrated circuit 20, the bracket 30, and the heat sink 40 assembled on the circuit board 2 is further assembled onto the housing 50. In this configuration, the protrusion 321 of the bracket 30 presses, to a side of the panel plate 51 of the housing 50, the part being positioned immediately above the center of the top surface of the integrated circuit 20 in the lateral width direction. In other words, the protrusion 321 of the bracket 30 presses the integrated circuit 20 from a position close to the integrated circuit 20 within a possible range, and presses the integrated circuit 20 toward the panel plate 51 of the housing 50. Therefore, the contact portion 43 of the heat sink 40 is pressed firmly by the protrusion 321 of the bracket 30 to the panel plate 51 of the housing 50.

The effects achieved by the heat dissipating structure 10 assembled in the manner described above will now be explained. In the assembled state, the surface of the main body 31 of the bracket 30 is held in close contact with the principal surface 21a of the case 21 of the integrated circuit 20. The bracket 30 is made of a material that is less heat-conductive than the case 21 of the integrated circuit 20. Therefore, even when the temperature of the bracket 30 is lower than that of the case 21 of the integrated circuit 20, the heat generated by the integrated circuit 20 is not easily conducted to the bracket 30. In other words, the second fastening member S3 that is exposed to the external does not easily become high in temperature.

Furthermore, in the assembled state, the surface of the contact portion 43 of the heat sink 40 is held in close contact with the principal surface 21b of the case 21 of the integrated circuit 20. The heat sink 40 is made of a material that is more heat-conductive than the case 21 of the integrated circuit 20. Therefore, when the temperature of the heat sink 40 is lower than that of the case 21 of the integrated circuit 20, the heat generated by the integrated circuit 20 is conducted to the heat sink 40.

Furthermore, in the assembled state, the surface of the contact portion 43 of the heat sink 40 is held in close contact with the surface of the concave portion 514 provided to the panel plate 51 of the housing 50. The housing 50 is made of a material that is less heat-conductive than the heat sink 40. Therefore, even when the temperature of the panel plate 51 is lower than that of the heat sink 40, the heat conducted to the heat sink 40 is not easily conducted to the housing 50. In other words, the panel plate 51 does not easily become high in temperature.

Furthermore, the space between the main body 41 of the heat sink 40 and the main body 31 of the bracket 30 serves as a channel for the air coming out from the cooling fan not illustrated. Therefore, the main body 41 of the heat sink 40 is always cooled by the air coming out from the cooling fan. In this manner, the main body 41 of the heat sink 40 dissipate the heat, when the heat sink 40 becomes heated, by the heat of the integrated circuit 20 conducted via the contact portion 43, to a temperature higher than the air coming out from the cooling fan.

In the manner described above, the heat generated by the integrated circuit 20 is dissipated via the heat sink 40, and the integrated circuit 20 is cooled thereby.

In the assembled state, the first fastening member S1 is fastened while the fastening hole 434 provided to the heat sink 40, the holding portion 22 provided to the case 21 of the integrated circuit 20, and the first fastening hole 311 provided to the bracket 30 are coaxially aligned in an overlapping manner. Therefore, the first fastening member S1 might become high in temperature. The first fastening member S1 is housed in the convex portion 511 of the panel plate 51 of the housing 50 in a manner spaced from the convex portion 511. Therefore, the first fastening member S1 that might become high in temperature is not exposed to the external of the housing 50.

Furthermore, in the assembled state, the first fastening member S2 is fastened while the fastening hole 435 provided to the heat sink 40, the holding portion 23 provided to the case 21 of the integrated circuit 20, and the first fastening hole 312 provided to the bracket 30 are coaxially aligned in an overlapping manner. Therefore, the first fastening member S2 might become high in temperature. The first fastening member S2 is housed in the convex portion 512 of the panel plate 51 of the housing 50 in a manner spaced from the convex portion 512. Therefore, the first fastening member S2 that might become high in temperature is not exposed to the external of the housing 50.

In the assembled state, the second fastening member S3 is exposed to the external of the housing 50. The second fastening member S3 is screwed into the second fastening hole 322 provided to the protrusion 321 of the bracket 30. Because the second fastening member S3 is positioned in a manner spaced from the case 21 of the integrated circuit 20, the second fastening member S3 does not easily become high in temperature. Furthermore, because the bracket 30 is made of a material that is less heat-conductive than the case 21 of the integrated circuit 20, the heat generated by the integrated circuit 20 is not easily conducted to the bracket 30. Therefore, the second fastening member S3 does not easily become high in temperature.

As described above, according to this embodiment, the first fastening member S1 might become high in temperature in the assembled state. According to the embodiment, the first fastening member S1 that might become high in temperature is housed in the convex portion 511 of the panel plate 51 of the housing 50 in a manner spaced from the convex portion 511. In other words, according to this embodiment, the first fastening member S1 that might become high in temperature can be positioned in a manner not exposed to the external of the housing 50. Furthermore, according to the embodiment, the first fastening member S2 is housed in the convex portion 512 of the panel plate 51 of the housing 50 in a manner spaced from the convex portion 512. In other words, according to this embodiment, the first fastening member S2 that might become high in temperature can be positioned in a manner not exposed to the external of the housing 50. In the manner described above, according to the embodiment, when the assembler touches the housing 50 or the like carelessly, the assembler can be prevented from touching the member high in temperature.

According to this embodiment, in the assembled state, the second fastening member S3 that is screwed into the second fastening hole 322 provided to the protrusion 321 of the bracket 30 is exposed to the external of the housing 50. Because the bracket 30 is made of a material that is less heat-conductive than the case 21 of the integrated circuit 20, the heat generated by the integrated circuit 20 is not easily conducted to the second fastening member S3, so that the second fastening member S3 does not easily become high in temperature. In the manner described above, according to this embodiment, the second fastening member S3, which does not easily become high in temperature, can be used to fix the heat dissipating structure 10 to the housing 50.

Furthermore, according to this embodiment, the surface of the main body 31 of the bracket 30 is brought into close contact into the principal surface 21a of the case 21 of the integrated circuit 20 in the assembled state. Furthermore, according to this embodiment, the surface of the contact portion 43 of the heat sink 40 is brought into close contact with the principal surface 21b of the case 21 of the integrated circuit 20 in the assembled state. The bracket 30 is made of a material that is less heat-conductive than the case 21 of the integrated circuit 20. Furthermore, the heat sink 40 is made of a material that is more heat-conductive than the case 21 of the integrated circuit 20. Therefore, according to the embodiment, when the temperature of the heat sink 40 is lower than that of the case 21 of the integrated circuit 20, the heat generated by the integrated circuit 20 is allowed to conduct to the heat sink 40.

Furthermore, according to this embodiment, the main body 41 of the heat sink 40 can be kept cooled by the air coming out from the cooling fan. In this manner, according to the embodiment, when the temperature of the main body 41 of the heat sink 40 is higher than that of the air coming out from the cooling fan, the heat sink 40 can dissipate the heat.

In the manner described above, according to the embodiment, the integrated circuit 20 can be cooled by allowing the heat generated by the integrated circuit 20 to dissipate.

According to this embodiment, the surface of the contact portion 43 of the heat sink 40 is brought into close contact with the surface of the concave portion 514 provided to the panel plate 51 of the housing 50 in the assembled state. The housing 50 is also made of a material that is less heat-conductive than the heat sink 40. Therefore, according to the embodiment, even when the temperature of the panel plate 51 is lower than that of the heat sink 40, the heat conducted to the heat sink 40 can be prevented from conducting easily to the housing 50. Therefore, according to the embodiment, when the assembler touches the housing 50 or the like carelessly, the assembler can be prevented from touching the high-temperature member.

In the embodiment, the second fastening member S3 is fastened to the panel plate 51 of the housing 50. By contrast, the first fastening member S1 and the first fastening member S2 are fastened to the heat sink 40 made of a plate material softer than the material of the panel plate 51 of the housing 50, and the first fastening member S1 and the first fastening member S2 are not fastened to the panel plate 51 of the housing 50. In this manner, according to this embodiment, common screws can be used for the second fastening member S3 and the other fastening members, not illustrated, that are fastened to the panel plate 51 of the housing 50. Therefore, according to the embodiment, the same fastening tool can be used, and the same torque can be applied to the fastening members during the work of fastening the panel plate 51 of the housing 50. In this manner, according to the embodiment, the efficiency of the assembly work can be improved. In this embodiment, for the first fastening member S1 and the first fastening member S2, screws having a smaller diameter than the second fastening member S3 are used. Therefore, fastening tool and torque of the first fastening member S1 and the first fastening member S2 are different from that of the second fastening member S3.

According to this embodiment, the heat sink 40 can be formed by bending or extruding the plate material. Therefore, according to the embodiment, the space can be saved compared with the structure in which the heat sink 40 is made from another heat dissipating member, for example, such as a cooling fin. Furthermore, the heat sink 40 having the shape according to the embodiment can reduce the cost, compared with when the heat sink is provided as other heat dissipating members.

According to this embodiment, in the electronic component 20 that generates heat, the terminals 24 of the electronic component 20 are soldered onto the through holes 2c provided to the circuit board 2, and the second engaging portions 332 and 342 provided to the bracket 30 are soldered onto the engaging holes 2a, 2b, respectively, provided to the circuit board 2, while the bracket 30 supporting the electronic component 20 is integrated with the heat sink 40. The second engaging hole 322 provided to the protrusion 321 of the bracket 30 is fastened to the housing 50, with the second fastening member S3. As mentioned earlier, in the configuration before the second fastening member S3 is fastened, the protrusion 321 of the bracket 30 is positioned slightly spaced from the panel plate 51 of the housing 50. Accordingly, the force in fastening the second fastening member S3 is prevented from from being applied excessively to the soldered portion. Therefore, according to the embodiment, cracking of the soldered portion resultant of a stress applied thereto can be prevented.

In addition, it is preferable that H<A+B is satisfied. H denotes a height of a head of the first fastening member S1, as described on FIG. 7. A denotes a depth by which the concave portion 514 recesses toward the bracket 30, as described on FIG. 5. B denotes a height by which the convex portion 511 bulges toward the side opposite to the bracket 30.

Second Embodiment

Figure 8:
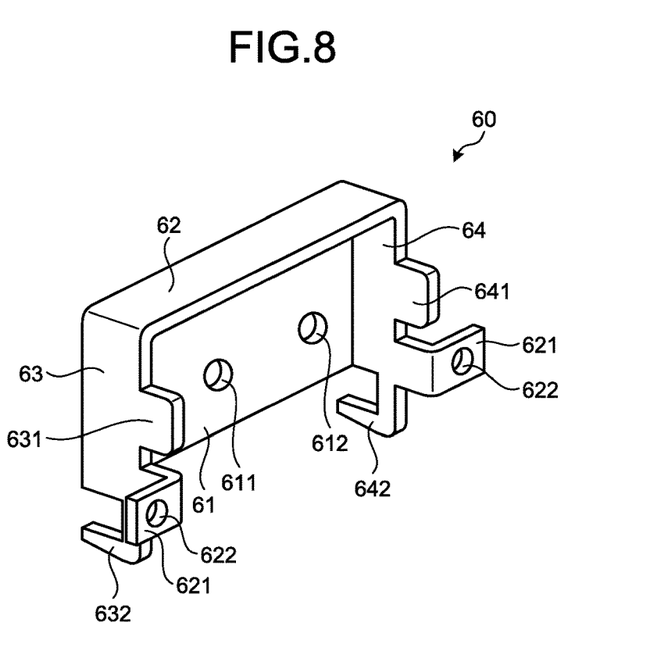
FIG. 8 is a perspective view illustrating another example of a bracket in a heat dissipating structure according to a second embodiment of the present invention.
Figure 9:
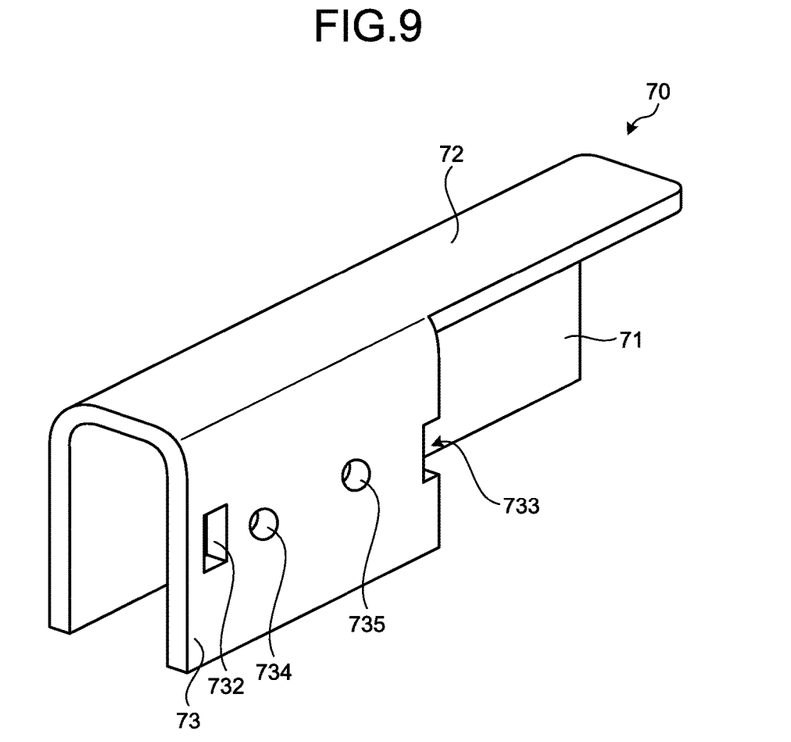
FIG. 9 is a perspective view illustrating another example of the heat sink in the heat dissipating structure according to the second embodiment.

A heat dissipating structure according to a second embodiment of the present invention will now be explained with reference to FIGS. 8 and 9. FIG. 8 is a perspective view illustrating another example of a bracket in a heat dissipating structure according to the second embodiment. FIG. 9 is a perspective view illustrating another example of a heat sink in the heat dissipating structure according to the second embodiment.

The heat dissipating structure according to this embodiment has a bracket 60 and a heat sink 70 that are structured differently from the bracket 30 and the heat sink 40 according to the first embodiment. The other structures are the same as those in the heat dissipating structure 10 according to the first embodiment. In the explanation hereunder, detailed explanations of the elements that are the same as those in the heat dissipating structure 10 will be omitted.

The bracket 60 includes a pair of protrusions 621. The pair of protrusions 621 are provided as a pair, to a side wall 63 and a side wall 64, respectively. The pair of protrusions 621 are provided uprightly from the side wall 63 and the side wall 64, respectively, in a manner extending outwardly in the lateral width direction of the side wall 63 and the side wall 64. The pair of protrusions 621 are provided along a plane that is in parallel with a main body 61.

A heat sink 70 is different from the heat sink 40 according to the first embodiment in that the insertion hole for inserting the protrusion 621 of the bracket 60 is not provided. Therefore, the heat sink 70 does not have any hole on the bent portion where a contact portion 73 meets a connecting portion 72.

A method for assembling the electronic device 1 including the bracket 60 and the heat sink 70 having the structures described above will now be explained.

The assembler brings the principal surface 21a of the case 21 of the integrated circuit 20 into contact with the main body 61 of the bracket 60, and brings the principal surface 21b of the case 21 of the integrated circuit 20 into contact with contact portion 73 of heat sink 70, while the integrated circuit 20, the bracket 60, and the heat sink 70 are aligned with respect to one another. In this configuration, the pair of protrusions 621 provided to the bracket 60 are positioned external of the integrated circuit 20, and of the contact portion 73 of the heat sink 70 in the lateral width direction. The assembler then assembles the integrated circuit 20, the bracket 60, and the heat sink 70 onto the circuit board 2. The assembler then assembles the integrated circuit 20, the bracket 60, and the heat sink 70 assembled onto the circuit board 2, to the housing 50. More specifically, the assembler lays and presses the pair of protrusions 621 provided to the bracket 60 to the panel plate 51 of the housing 50. The assembler then fastens fastening members while a fastening holes 622 of the bracket 60 and the fastening holes on the panel plate 51 of the housing 50 are coaxially aligned in an overlapping manner. In the manner described above, the pair of protrusions 621 are positioned, in the assembled state, external of the contact portion 73 of heat sink 70 in the lateral width direction, and are fastened to the fastening holes, respectively, provided to the panel plate 51 of the housing 50.

As described above, according to this embodiment, the insertion hole for inserting the protrusion 621 provided to the bracket 60 does not necessary need to be provided to the heat sink 70. Accordingly, a larger surface area of the heat sink 70 can be ensured, compared with that in the heat sink 40 according to the first embodiment. In other words, higher heat conductivity can be ensured in the heat sink 70, compared with that in the heat sink 40 according to the first embodiment. Therefore, according to the embodiment, the heat generated by the integrated circuit 20 is allowed to dissipate more so that the integrated circuit 20 can be cooled further.

Explained above is the heat dissipating structure 10 and the electronic device 1 according to the present invention, but the present invention may be implemented in any ways other than those described above in the embodiments. The structure of the heat dissipating structure 10 explained above is merely an example, and the present invention is not limited thereto.

The structure of the bracket 30 explained above in the embodiments is merely an example, and the bracket 30 may have any structures capable of assembling the integrated circuit 20 to the housing 50.

The structure of the heat sink 40 explained above in the embodiments is merely an example, and the heat sink 40 may have any structures capable of dissipating the heat generated by the integrated circuit 20.

The shapes of the first engaging portion 331 of the bracket 30 and the engaging hole 432 of the heat sink 40, and the shapes of the first engaging portion 341 of the bracket 30 and the engaging cutout 433 of the heat sink 40, both of which are for aligning the bracket 30 with respect to the heat sink 40, are not limited to the examples described above. For example, an engaging hole may be provided to the bracket 30, and an engagement accepting portion may be provided to the heat sink 40.

According to the present disclosure, a member becomes high in temperature is not exposed to the external of the housing, advantageously.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A heat dissipating structure comprising:
an electronic component that generates heat;
a bracket configured to support the electronic component;
a heat dissipating member configured to dissipate the heat generated by the electronic component;
a housing to which the bracket is assembled;
a first fastening member configured to be inserted into a first fastening hole provided to the bracket, and into a fastening hole provided to the heat dissipating member, and assemble the electronic component to the bracket and the heat dissipating member, while one surface of the electronic component is held in close contact with the bracket, and another surface facing the one surface is held in close contact with the heat dissipating member; and
a second fastening member configured to be inserted into a second fastening hole provided separately from the first fastening hole to the bracket, and into a fastening hole provided to the housing, and assemble the bracket to the housing, while the heat dissipating member is pressed against the housing, wherein
the heat dissipating member has one surface that is held in close in contact with the housing, the one surface being on a side opposite to a surface that is held in close contact with the electronic component, in a state in which the bracket is assembled to the housing, and
the first fastening member is configured to be positioned spaced from the housing in the state in which the bracket is assembled to the housing, wherein
the housing includes a convex portion that is disposed at a position corresponding to the first fastening member, and that is provided bulging toward a side opposite to the bracket, and a concave portion that is disposed at a position corresponding to a position between the first fastening member and the second fastening member, and is provided by making a recess toward the bracket, in the state in which the bracket is assembled to the housing, and
$H<A+B$ is satisfied, where H denotes a height of a head of the first fastening member, A denotes a depth by which the concave portion recesses toward the bracket, and B denotes a height by which the convex portion bulges toward the side opposite to the bracket.

2. The heat dissipating structure according to claim 1, wherein
the bracket includes a protrusion that is provided with the fastening hole,
the heat dissipating member has an insertion hole enabled to be inserted with the protrusion, and
the bracket is configured to be assembled to the housing with the protrusion inserted into the insertion hole, and with the protrusion kept in close contact with the housing.

3. The heat dissipating structure according to claim 2, wherein the protrusion is provided at a center of the bracket in a width direction.

4. The heat dissipating structure according to claim 1, wherein
the bracket includes an engaging portion,
the heat dissipating member includes an engagement accepting portion to which the engaging portion is engaged, and
the bracket and the heat dissipating member are configured to be aligned with respect to each other by the engaging portion and the engagement accepting portion.

5. An electronic device comprising:
a circuit board; and
the heat dissipating structure according to claim 1.

* * * * *